United States Patent [19]

Hiruta

[11] Patent Number: 4,713,356

[45] Date of Patent: Dec. 15, 1987

[54] MANUFACTURING MOS SEMICONDUCTOR DEVICE WITH PLANARIZED CONDUCTIVE LAYER

[75] Inventor: Yoichi Hiruta, Yokohama, Japan

[73] Assignee: Kabushiki Kaisha Toshiba, Kawasaki, Japan

[21] Appl. No.: 833,594

[22] Filed: Feb. 27, 1986

[30] Foreign Application Priority Data

Feb. 28, 1985 [JP] Japan ................................ 60-39235

[51] Int. Cl.$^4$ .......................................... H01L 21/441
[52] U.S. Cl. ..................................... 437/41; 437/193; 437/231; 437/192
[58] Field of Search ......................... 29/571, 590, 591; 427/88, 89, 90, 91

[56] References Cited

U.S. PATENT DOCUMENTS

| | | | |
|---|---|---|---|
| 4,274,909 | 6/1981 | Venkataraman et al. | 129/571 |
| 4,462,149 | 7/1984 | Schwabe | 29/571 |
| 4,512,073 | 4/1985 | Hsu | 29/571 |
| 4,616,401 | 10/1986 | Takeuchi | 29/571 |

OTHER PUBLICATIONS

Gargini et al., "WOS: Low–Resistance Self–Aligned Source, Drain and Gate Transistors", Technical Digest of IEDM, pp. 54–57, (1981).

Moriya et al., "Encroachment-Free Tungsten CVD Process for Self-Aligned Source-Drain-Gate Mettalization", Digest of Technical Papers of Symposium on VLSI Technology, No. 83, (1983).

Primary Examiner—Olik Chaudhuri
Attorney, Agent, or Firm—Finnegan, Henderson, Farabow, Garrett & Dunner

[57] ABSTRACT

A method of manufacturing a semiconductor device wherein the proportion of the area occupied by the source and drain regions can be reduced. In this method, the side walls of a gate electrode are first selectively deposited with an insulating film, then conductive material layers are selectively formed on the source and drain regions, partially extending to side portions of an element isolation regions, and, after forming an insulating protective film over the entire surface of the resultant structure, contact holes are formed to reach the conductive material layers for forming source and drain wiring layers.

11 Claims, 18 Drawing Figures

MANUFACTURING MOS SEMICONDUCTOR DEVICE WITH PLANARIZED CONDUCTIVE LAYER

BACKGROUND OF THE INVENTION (a) Field of the Invention

The present invention relates to a method of manufacturing a semiconductor device, and more particularly, to a method of manufacturing a MOS transistor with improved source and drain wiring layers.

(b) Description of the Prior Art

Conventionally, MOS transistors are manufactured, for example, in the way shown in FIGS. 1A to 1C. First, field oxide film 12 is formed on the surface of p-type semiconductor substrate 11, and gate oxide film 14 is formed on element region 13 surrounded by film 12. After performing channel ion-implantation in region 13, gate electrode 15 of polycrystalline silicon is formed on film 14 (FIG. 1A). The portion of film 14 corresponding to the prospective source and drain regions is then selectively removed. The entire surface is oxidized to form oxide film 16, and an n-type impurity is ion-implanted to form $n^+$-type source and drain regions 17 and 18 (FIG. 1B). SiO$_2$ film 19 and BPSG (boro-phosphosilicate glass) film 20 are then deposited by a CVD method to protect and insulate the transistor and to make even the element region. Contact holes 21 (for the source and drain regions) and Al wiring layers 22 are formed, thus preparing a MOS transistor (FIG. 1C).

In conventional MOS transistors, however, the following drawbacks have appeared with the recent developments in element micropatterning for high integration in integrated circuits. For example, as the junction between source and drain regions 17 and 18 is made shallower in order to further reduce element size, the surface resistance of regions 17 and 18 and the junction resistance of gate electrode 15 increase, resulting in a significantly longer delay time. In addition, as channel length decreases, the so-called short channel effect can occur, reducing the threshold voltage of the transistor and making stable transistor characteristics difficult to obtain. In order to resolve these problems, it is proposed to deposit tungsten over the source and drain regions and the gate electrode, as shown in FIG. 2 (Japanese Patent Disclosure No. 58-18965). This method will be described below.

After forming field oxide film 12 on the surface of semiconductor substrate 11, gate oxide film 14 and gate electrode 15 are formed on element region 13. SiO$_2$ film 31 is then formed over the entire surface by a CVD method (FIG. 2A). Film 31 is etched using a sputter etching technique or the like to so that portions of film 31 remain only on the side walls of electrode 15 (FIG. 2B). Oxide film 32 is then formed over the entire surface of the element region by thermal oxidation. An n-type impurity is ion-implanted in element region 13 through film 32 to form source and drain regions 17 and 18 (FIG. 2C). After removing film 32, tungsten (W) layer 33 is selectively deposited to a thickness of 1000 Å on regions 17 and 18 and gate electrode 15 (FIG. 2D).

As shown in FIG. 2, a CVD SiO$_2$ film and a BPSG film are then deposited. Contact holes (for source and drain regions) and wiring are formed, thus preparing a MOS transistor.

According to the method shown in FIG. 2, however, tungsten layer 33 is deposited over source and drain regions 17 and 18 and gate electrode 15. As a result, a small amount of tungsten is also deposited on film 31 (on the side walls of the gate electrode) and on film 12, thus reducing the insulation properties between electrode 15 and regions 17 and 18 and overall inter-element insulation properties. A problem is thus created for both circuit reliability and high integration. If the tungsten attached to film 31 and deposited on film 12 is etched to improve insulation properties, since the tungsten layer is only about 1,000 Å damage may result to the tungsten layer itself and also to the underlying substrate, thus making good contact difficult to obtain.

The following drawbacks are thus common to the above two conventional methods.

The size of element region 13 in the MOS transistor is determined by gate area and the size of source and drain regions 17 and 18. Even if the element size is further reduced, the proportion of element region 13 occupied by regions 17 and 18 remains large. In addition, with the conventional techniques, contact holes 21 are formed to be separated from gate electrode 15 in order to preserve the insulation properties between the wiring layers for electrode 15 and the source and drain regions. As a result, the area of, for example, drain region 18 increases. Another problem is that the distance separating the wiring layers cannot be made smaller than the precision of the mask used.

SUMMARY OF THE INVENTION

It is an object of the present invention to provide a method of manufacturing a semiconductor device, wherein, the proportion of the area occupied by the source and drain regions is reduced without adversely affecting the characteristics of the semiconductor device, and high element integration and high speed operation are made possible.

According to the present invention, there is provided a method of manufacturing a semiconductor device, comprising the steps of:

(a) forming an element isolation region in a surface of a semiconductor substrate;

(b) forming a gate oxide film on an element region of the semiconductor substrate, the element region being surrounded by the element isolation region;

(c) selectively forming a gate electrode on the gate oxide film;

(d) forming source and drain regions in the semiconductor substrate using the gate electrode as a mask;

(e) selectively removing the portion of the gate oxide film on the source and drain regions;

(f) forming an insulating film on side walls of the gate electrode;

(g) depositing a conductive material layer over the entire surface of the resultant structure;

(h) etching back the portion of the conductive material layer on the gate electrode and leaving the portion of the conductive material layer on the source and drain regions;

(i) forming an insulating protective film over the entire surface of the resultant structure;

(j) forming contact holes in the protective film; and (k) filling a conductive material in the contact holes and forming wiring layers which are connected to the source and drain regions.

The present invention also provides a method as described above which further includes the step of forming another conductive material layer, after the step (h) and before the step (i), one side of which is in contact with the remaining conductive material layer and the other side of which extends along one side of the adjacent element isolation region such that the contact holes formed in the step (j) are in contact with the other conductive material layer.

BRIEF DESCRIPTION OF THE DRAWINGS

FIG. 4B' is a sectional view corresponding to FIG. 4B showing another modification of the present invention.

DESCRIPTION OF THE PREFERRED EMBODIMENTS

The embodiments of the present invention will be described below with reference to the accompanying drawings.

Figure 3A:
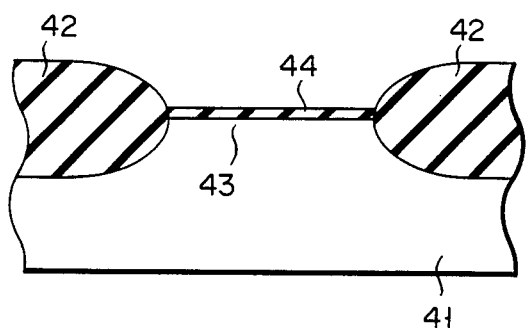
FIGS. 3A to 3G are sectional views showing steps in the manufacture of a MOS semiconductor device according to a method of the present invention.

First, field oxide film 42 is formed on the surface of p-type silicon substrate 41. Gate oxide film 44 of polycrystalline silicon is then formed on element region 43 surrounded by film 42 (FIG. 3A). After a polycrystalline silicon film is deposited over the entire surface, the polysilicon film is selectively etched by photoetching to form gate electrode 45 of polycrystalline silicon.

Figure 3B:
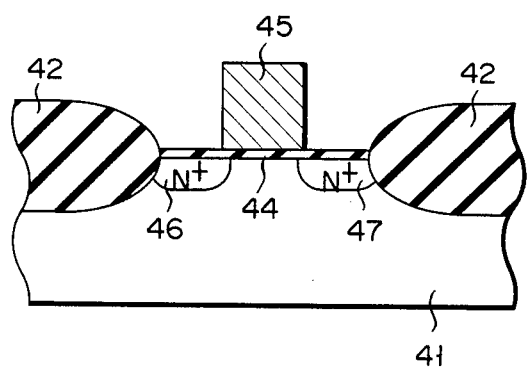
Figure 3C:
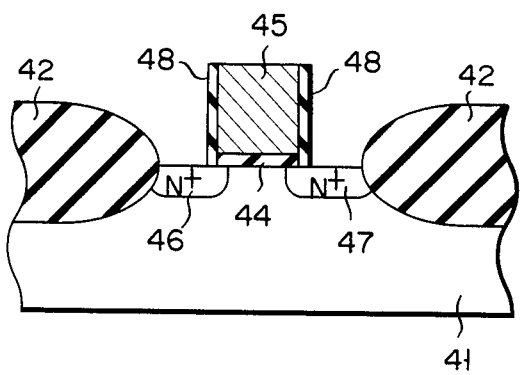
Figure 3D:
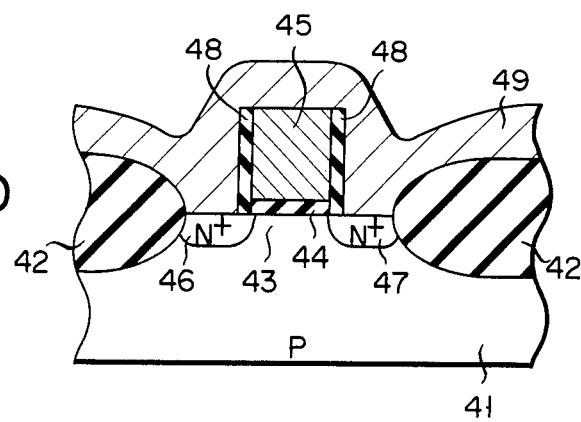
Figure 3E:
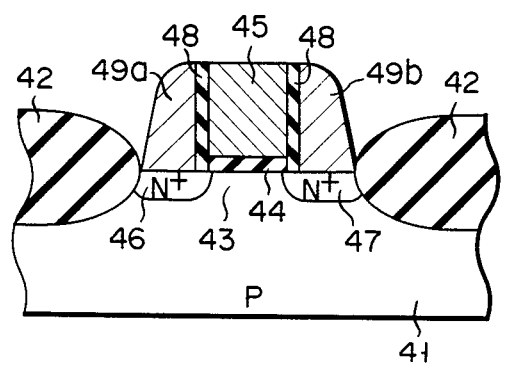

An n-type impurity is then ion-implanted in substrate 41 using electrode 45 as a mask to form n+-type source and drain regions 46 and 47 (FIG. 3B). SiO$_2$ film 48 is formed over the entire surface using a CVD method. Film 48 is sputter-etched with an inert gas to remove the portions of film 48 on electrode 45 and source and drain regions 46 and 47 and to leave film 48 only on the side walls of electrode 45 (FIG. 3C). First tungsten (W) layer 49 is deposited over the entire surface (FIG. 3D).

Figure 3F:
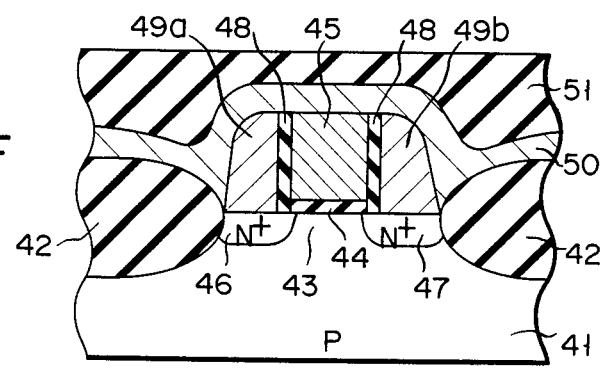

W layer 49 except for its portion on the side walls of electrode 45 is removed by sputter etching, thus forming first W layers 49a and 49b. Layers 49a and 49b are in contact with source and drain regions 46 and 47. After depositing second W layer 50 over the entire surface, a level surface is formed by applying resist 51, having a low viscosity of 8 to 12 cp, using spin coating (4,000 rpm) (FIG. 3F).

The portion of second W layer 50 on gate electrode 45 is then removed by etch-back. Then, a portion of first W layer 49 which is located on both fringe portions of the gate electrode 45 and a portion of layer 50 are etched off using a photoetching process to form second W layers 50a and 50b. One side of each of layers 50a and 50b is in contact with layer 49a or 49b, respectively, and the other side of each thereof extends over adjacent element isolation region 42.

Figure 3G:
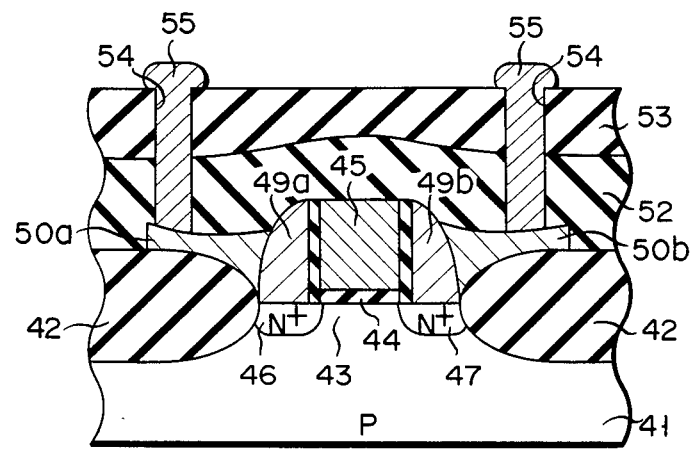

CVD SiO$_2$ film 52 and BPSG film 53 are then formed over the entire surface. Portions of films 53 and 52 corresponding to layer 50a and 50b are selectively removed to form contact holes 54. Aluminum wiring layers 55 are then formed in contact holes 54, thus preparing a MOS transistor (FIG. 3G).

According to the above embodiment, the following effects are obtained.

(1) After forming source and drain regions 46 and 47 and leaving film 48 only on the side walls of electrode 45, W layer 49 is deposited over the entire surface. Since W layer 49 is etched by sputter etching so that it remains only on the side walls of electrode 45, remaining layers 49a and 49b are self-aligned with the source and drain regions. In addition, since the area of regions 46 and 47 is determined by the width of layers 49a and 49b, the area of regions 46 and 47 can be reduced considerably.

Figure 1A:
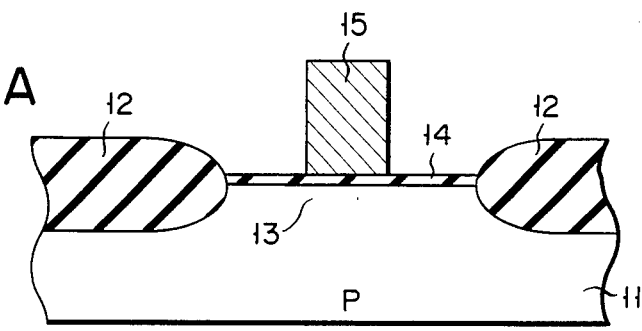
FIGS. 1A to 1C are sectional views showing steps in the manufacture of a conventional MOS semiconductor device.
Figure 1B:
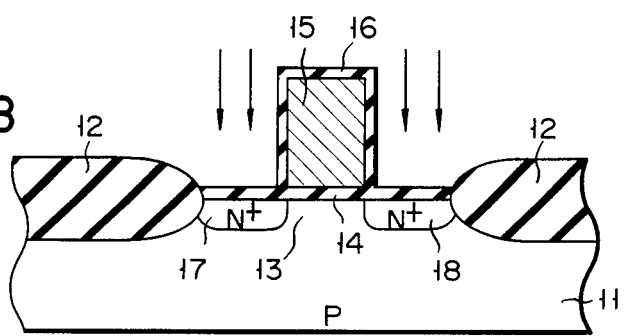
Figure 1C:
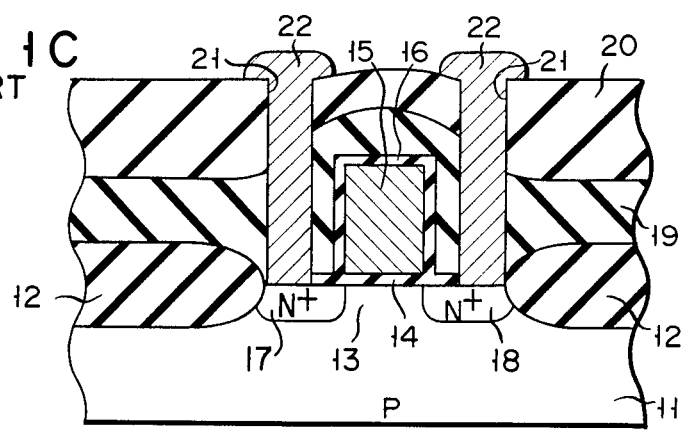
Figure 2A:
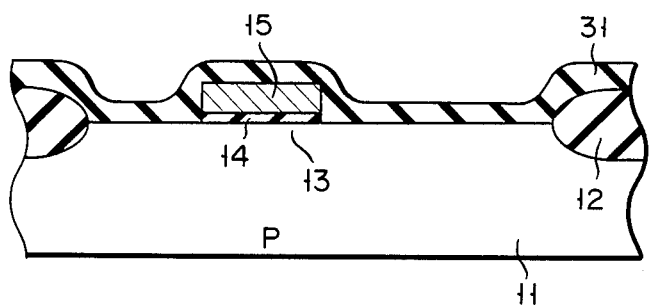
FIGS. 2A to 2D are sectional views showing steps in the manufacture of a conventional MOS semiconductor device according to another method.
Figure 2B:
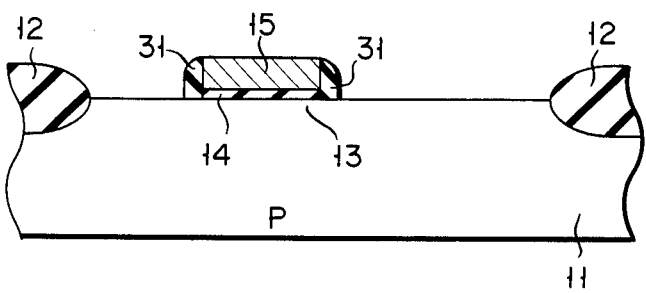
Figure 2C:
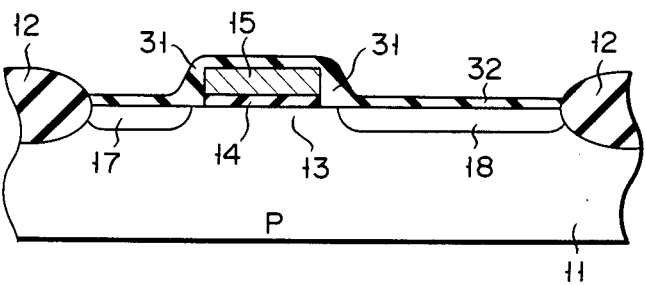
Figure 2D:
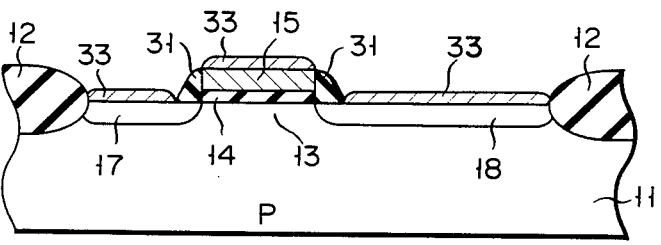

In fact, the width of layers 49a and 49b can be reduced to as little as about 0.1 μm. Therefore, when a transistor with a gate length of 1 μm is fabricated according to the above embodiment, the area of the element region can be reduced to about 2/5 of the conventional device shown in FIG. 1C.

(2) By reducing the area of the element region, the junction capacitance of source and drain regions 46 and 47 can be reduced, thus allowing high speed operation and high element integration.

(3) As Al wiring layers 55 are in contact with layers 50a and 50b through contact holes 54, contact resistance is reduced, and the sectional area of wiring layers 55 can be made smaller than in a conventional device. This facilitates to micropatterning.

(4) Since layers 49a and 49b are thick, the surfaces of source and drain regions 46 and 47 will not receive any damage from etching or other subsequent steps.

(5) Because layers 50a and 50b extend from the element region as far as field oxide film 42, it is possible to form BPSG film 51 with a flat surface, and Al wiring layers 55 can be formed easily.

According to the first embodiment, the same material is used for both the first (49a and 49b) and second (50a and 50b) conductive material layers, but different materials can also be used.

A modification of the present invention will now be described with reference to FIGS. 4A to 4C.

Just as in FIGS. 3A to 3C, field oxide film 42 is formed on the surface of p-type silicon substrate 41. Gate electrode 45 is formed on element region 43 through gate oxide film 44. N+-type source and drain regions are formed in the surface of element region 43, and SiO$_2$ film 48 is formed and selectively removed so that it remains only on the side walls of electrode 45.

Figure 4A:
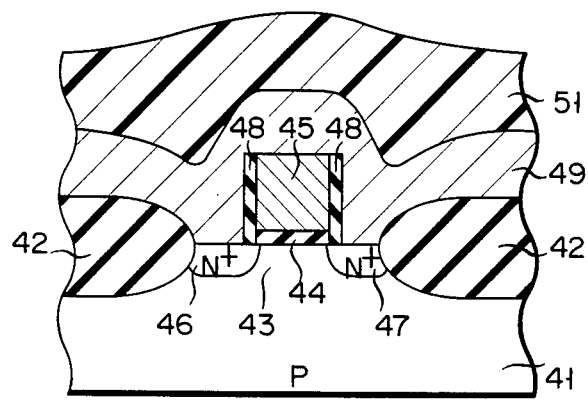
FIGS. 4A to 4C are sectional views showing steps in the manufacture of a MOS semiconductor device according to a modification of the present invention.
Figure 4B:
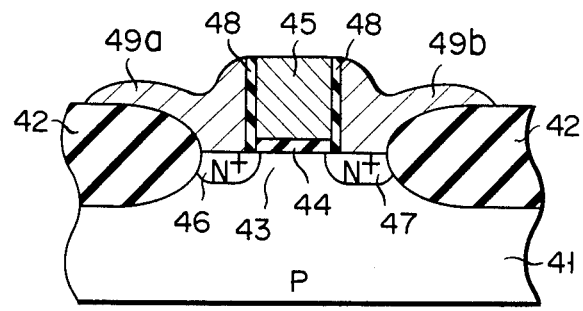
Figure 4B:
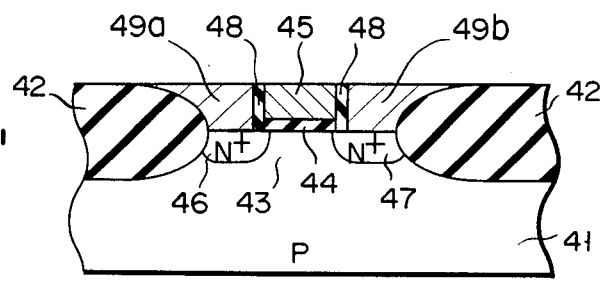
Figure 4C:
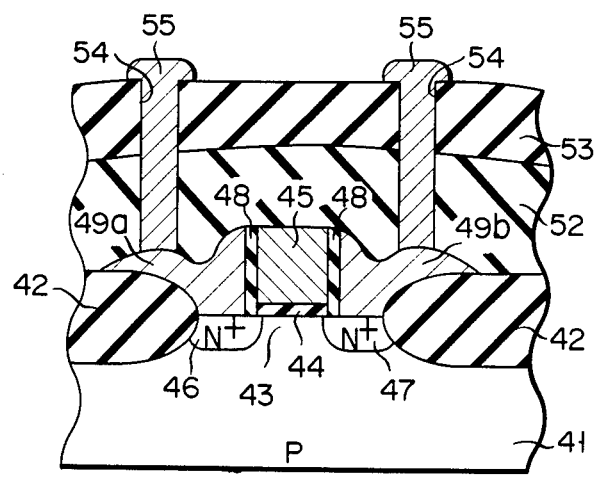

As shown in FIG. 4A, first W layer 49 is deposited over the entire surface. A fairly high viscosity resist (40 to 100 cp) is then applied by spin coating (4,000 rpm) over the entire surface to form resist layer 51, having a curvature roughly corresponding to the projections and recesses of layer 49.

Resist 51 and the portion of first W layer 49 on electrode 45 are then removed by etch-back. Subsequently a portion of first W layer 49 which is located on both fringe portions of the gate electrode 45 is etched off to form first W layers 49a and 49b. One side of each of layers 49a and 49b is in contact with region 46 or 47, respectively, and the other side of each thereof extends over adjacent field oxide film 42 (FIG. 4B).

Then, just as in FIG. 3G of the previous embodiment, CVD SiO$_2$ film 52 and BPSG film 53 are formed. Contact holes 54 and wiring layers 55 are then formed, thus preparing a MOS transistor (FIG. 4C). The structure in FIG. 4C differs from that in FIG. 3G in that Al wiring layers 55 are in contact with the portions of layers 49a and 49b extending over film 42.

According to the second embodiment, since layers 49a and 49b can be formed in contact with regions 46 and 47 and to extend over film 42 using only one deposition process of tungsten layer, fewer steps are necessary than with the first embodiment.

In addition, the following method is also possible as a simple means of making level the surface of film 53. Gate electrode 45 is formed to a level slightly lower than in FIG. 4B (e.g., roughly equal to that of film 42). First W layer 49 and resist layer 51 are then deposited and selectively removed by etch-back so that the upper surfaces of film 42, layers 49a and 49b, and electrode 45 are substantially flush with each other, as shown in FIG. 4B'. This method is equally applicable in method, since layers 49a and 49b can be formed in contact with regions 46 and 47 and to extend over film 42 using only an etch-back technique, fewer steps are necessary than with the first embodiment and BPSG film 53 can be formed on flush with other surrounding surface.

Tungsten (W) is used in the above embodiments as the material for the conductive material layers, but the present invention is not limited to this. It is also possible to use, for example, another metal or polycrystalline silicon. Al is used for the wiring in the embodiments above, but tungsten or the like can also be used.

According to the present invention as described above, reduction of the element region area provides various advantages, such as high element integration and high speed element operation.

What is claimed is:

1. A method of manufacturing a semiconductor device, comprising the sequential steps of:
    (a) forming an element isolation region in a surface of a semiconductor substrate;
    (b) forming a gate oxide film on an element region of said semiconductor substrate, said element region being surrounded by said element isolation region;
    (c) selectively forming a gate electrode on said gate oxide film;
    (d) forming source and drain regions in said semiconductor substrate using said gate electrode as a mask;
    (e) selectively removing a portion of gate oxide film on said source and drain regions;
    (f) forming an insulating film on side walls of said gate electrode;
    (g) depositing a conductive material layer on the entire surface of the resultant structure;
    (h) etching back said conductive material layer to totally remove said conductive material layer deposited on said gate electrode and on a top surface of said insulating film formed in step (f) to expose an upper surface of said gate electrode and said top surface of said insulating film to leave a portion of said conductive material layer remaining on said source and drain regions, a top surface of said portion of said conductive material layer remaining on said source and drain regions being substantially flush with said upper surface of said gate electrode and with said top surface of said insulating film;
    (i) forming an insulating protective film over the entire surface of the resultant structure;
    (j) forming contact holes in said protective film; and
    (k) filling a conductive material in said contact holes and forming wiring layers which are connected to said source and drain regions.

2. A method according to claim 1, wherein in said step (h) said conductive material layer is left only on said source and drain regions, and another conductive material layer is deposited after said step (h) and before said step (i), with one side thereof in contact with said remaining conductive material layer and the other side of which extends along one side of said adjacent element isolation region, said contact holes formed in step (j) being in contact with said another conductive material layer.

3. A method according to claim 1, wherein said step (c) a level of said gate electrode is made to be substantially equal to that of said element isolation region.

4. A method according to claim 1, wherein said conductive material layer in said step (g) is a metal layer.

5. A method according to claim 4, wherein said metal layer comprises tungsten.

6. A method according to claim 1, wherein said conductive material layer in said step (g) is a polysilicon layer.

7. A method according to claim 1, wherein in said step (h) said conductive material layer is left not only on said source and drain regions but also on a surrounding portion of said element isolation region.

8. A method according to claim 7, wherein in said step (h) after depositing said conductive material layer, a resist layer having a viscosity of 40 to 100 cp (centipoise) is formed by spin-coating to have a curvature corresponding to projections and recesses in the upper surface of said conductive material layer, and is etched back thereafter.

9. A method according to claim 7, wherein said contact holes in said step (j) are vertically formed in a position in contact with the upper surface of said remaining conductive material layer on said element isolation region.

10. A method according to claim 1, wherein said conductive material in said step (k) consists of the same material as said conductive material in said step (g).

11. A method according to claim 1, wherein said conductive material in said step (k) consists of a different material from said conductive material in said step (g).

* * * * *